(12) United States Patent
Imai et al.

(10) Patent No.: US 9,270,237 B2
(45) Date of Patent: Feb. 23, 2016

(54) SEMICONDUCTOR MEMORY WITH THRESHOLD CURRENT SETTING CIRCUIT

(71) Applicant: Renesas Electronics Corporation, Kawasaki-shi, Kanagawa (JP)

(72) Inventors: Hitoshi Imai, Kanagawa (JP); Hirotatsu Tanaka, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 195 days.

(21) Appl. No.: 14/063,747

(22) Filed: Oct. 25, 2013

(65) Prior Publication Data

US 2014/0117212 A1 May 1, 2014

(30) Foreign Application Priority Data

Oct. 29, 2012 (JP) ................................. 2012-238045

(51) Int. Cl.
*H03F 3/08* (2006.01)
*H04N 1/00* (2006.01)

(52) U.S. Cl.
CPC ................ *H03F 3/087* (2013.01); *H03F 3/082* (2013.01); *H04N 1/00997* (2013.01); *H04N 2201/02497* (2013.01); *H04N 2201/03166* (2013.01)

(58) Field of Classification Search
CPC ..... H03F 3/082; H03F 3/087; H04N 1/00997; H04N 2201/02497; H04N 2201/03166
See application file for complete search history.

(56) References Cited

U.S. PATENT DOCUMENTS

| 6,885,249 | B2 | 4/2005 | Suzunaga |
| 7,449,669 | B2* | 11/2008 | Sakura ....................... 250/214 A |
| 7,548,700 | B2* | 6/2009 | Furuya et al. ................ 398/202 |
| 7,635,837 | B2 | 12/2009 | Uo et al. |
| 7,787,780 | B2 | 8/2010 | Suzunaga |
| 8,155,537 | B2 | 4/2012 | Saitou et al. |

FOREIGN PATENT DOCUMENTS

| JP | 2004-179982 A | 6/2004 |
| JP | 2006-340072 A | 12/2006 |
| JP | 2007-96593 A | 4/2007 |
| JP | 2008-236392 A | 10/2008 |
| JP | 2010-178327 A | 8/2010 |

* cited by examiner

*Primary Examiner* — Francis M Legasse, Jr.
(74) *Attorney, Agent, or Firm* — Foley & Lardner LLP

(57) ABSTRACT

A semiconductor device includes a first trans-impedance amplifier, a second trans-impedance amplifier, a peak hold circuit, a comparator and a threshold current setting circuit. The first trans-impedance amplifier converts a first current signal generated by a first photodiode, into which an optical signal is input, into a first voltage signal. The second trans-impedance amplifier converts a second current signal generated by a second photodiode, to which an optical signal is blocked, into a second voltage signal. The peak hold circuit holds the peak value of the first voltage signal. The comparator outputs a pulse on the basis of the first and second voltage signals. The threshold current setting circuit draws out a threshold current.

6 Claims, 14 Drawing Sheets

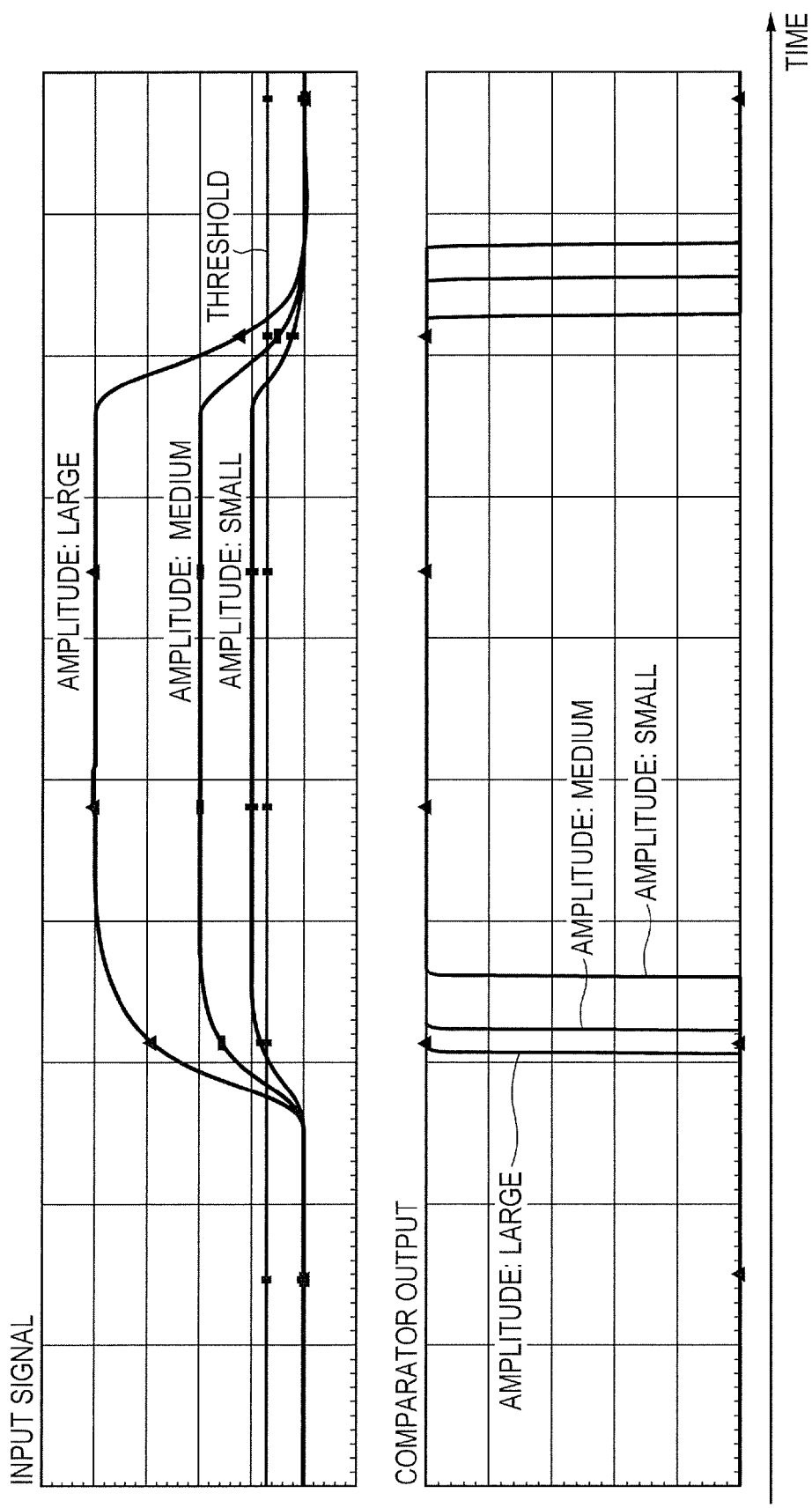

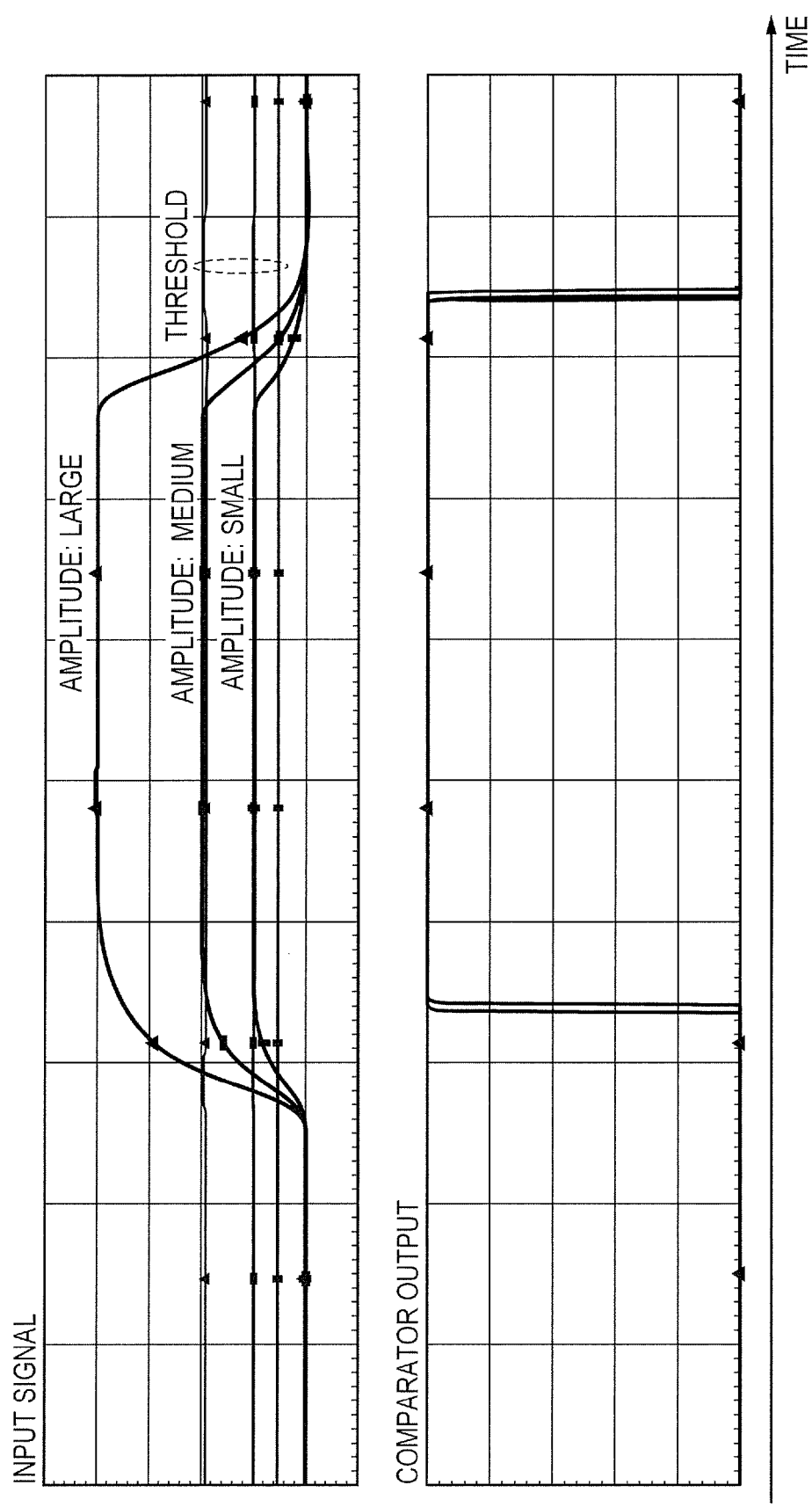

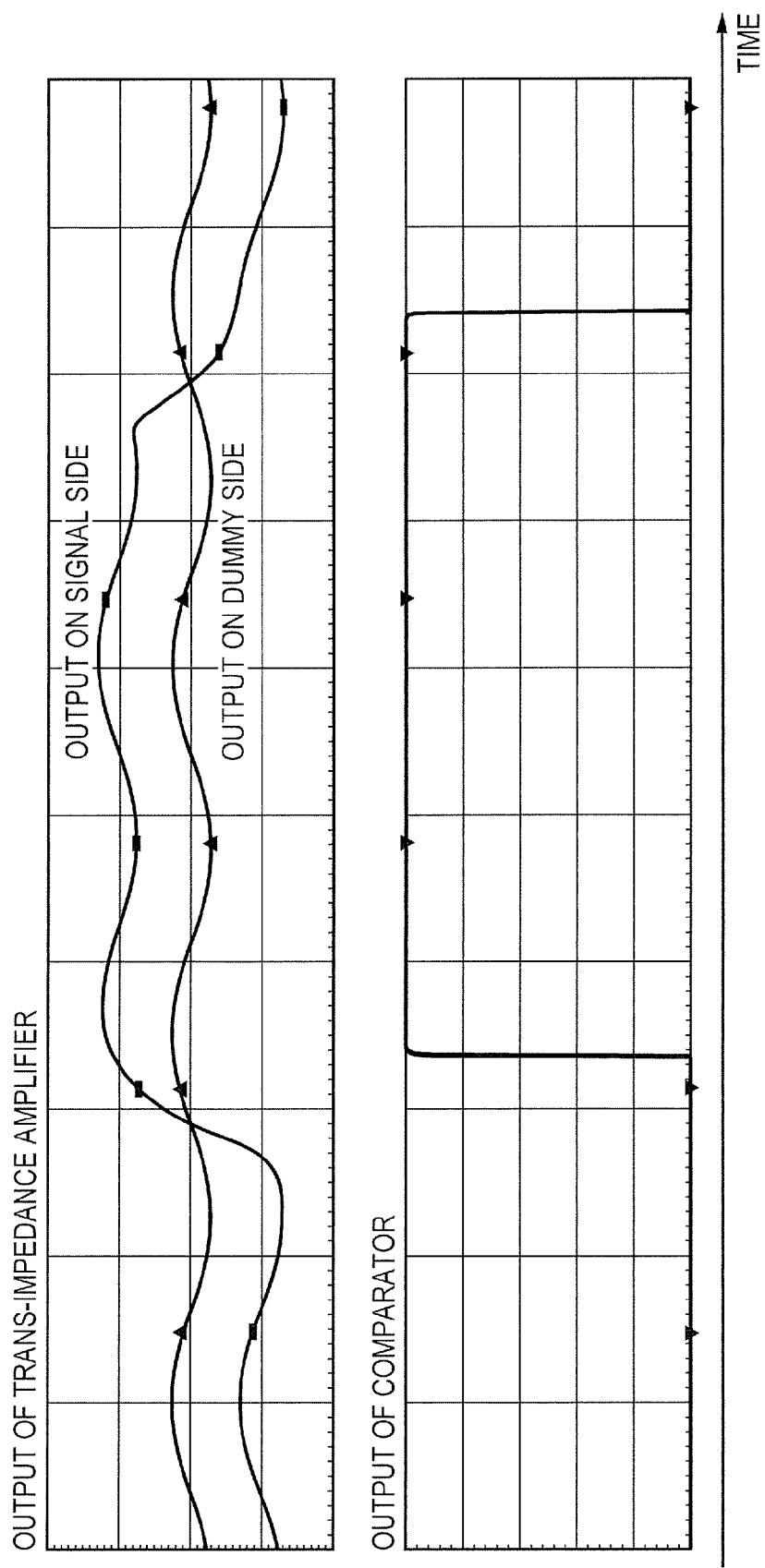

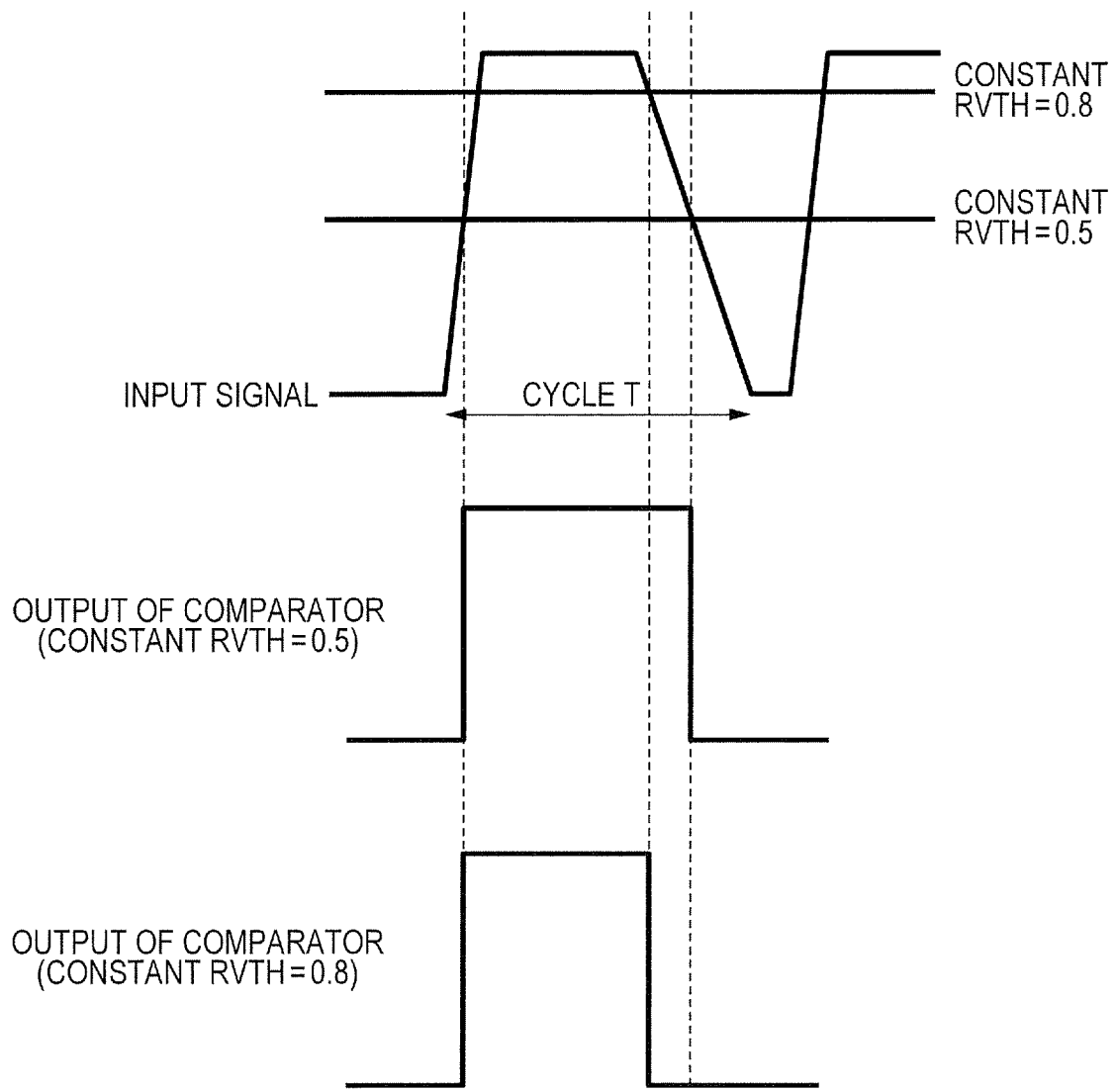

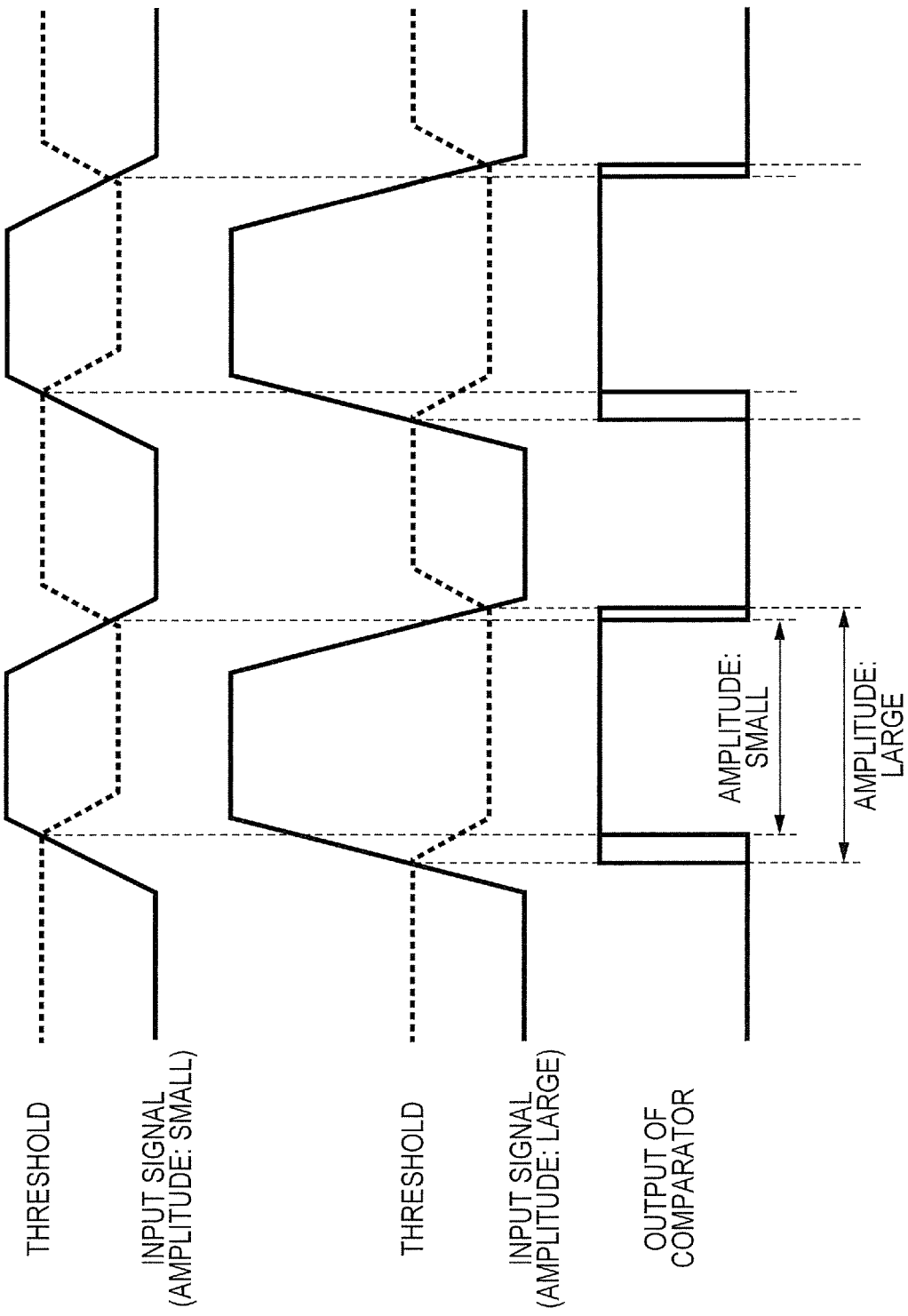

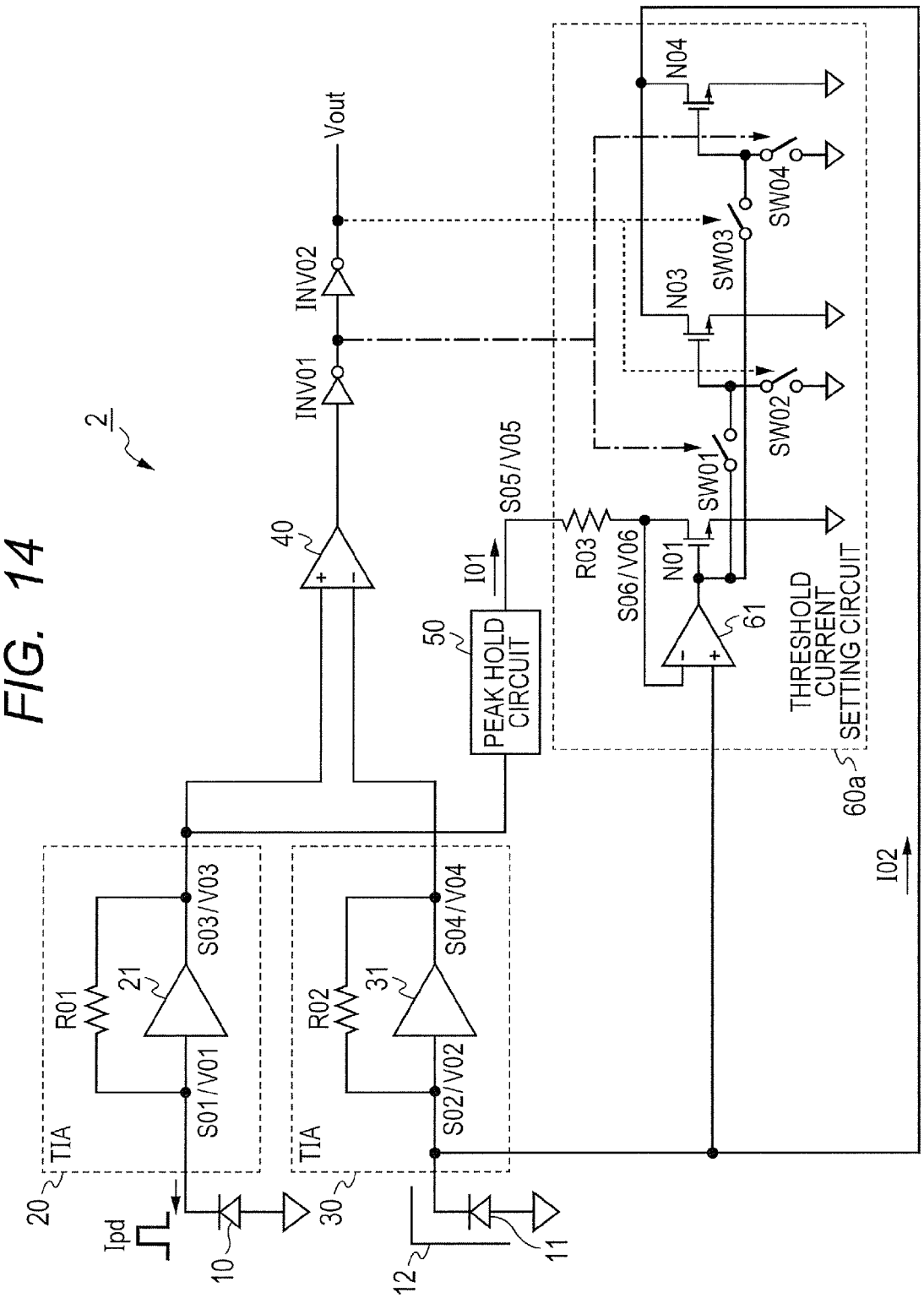

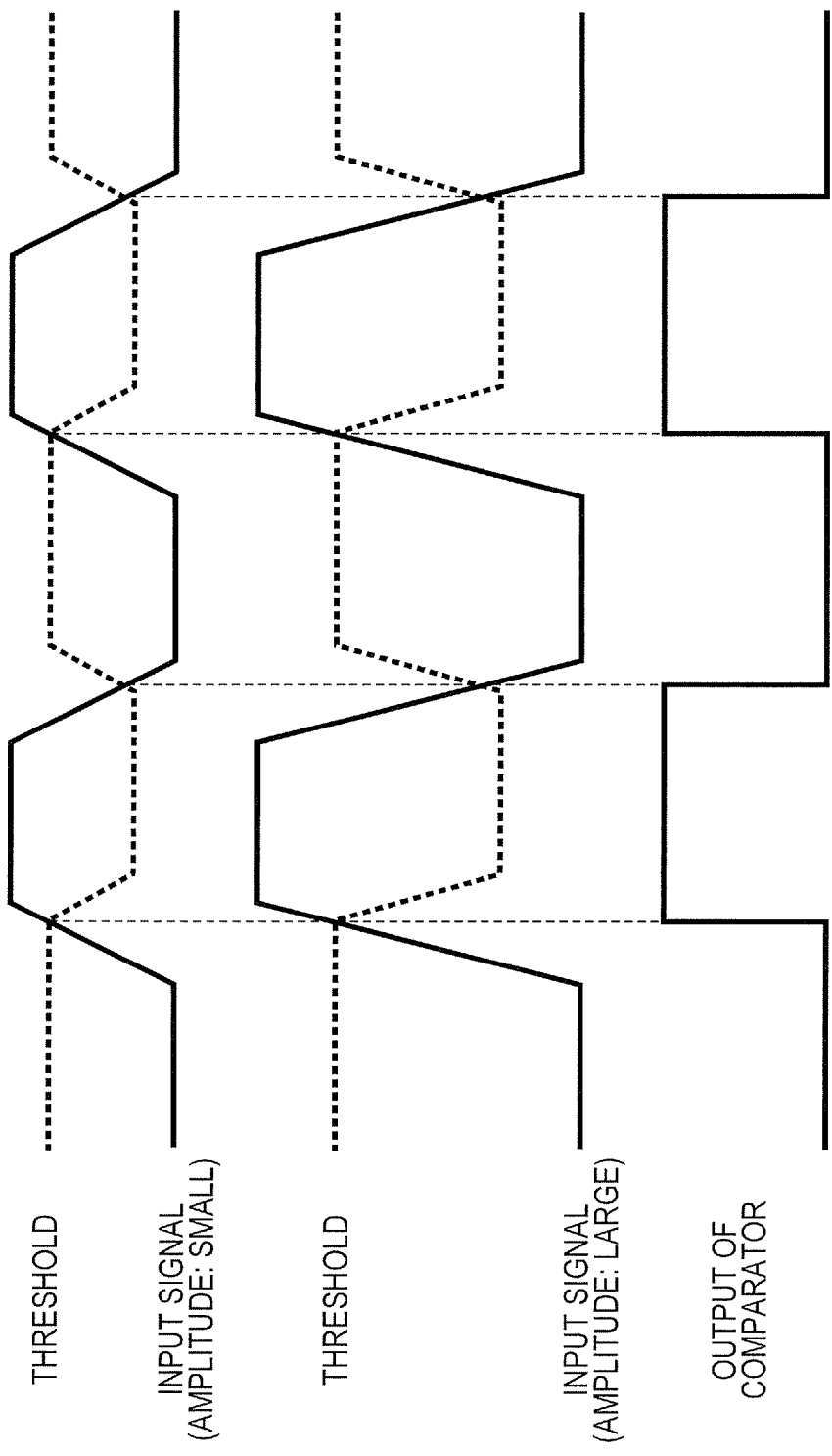

US 9,270,237 B2

SEMICONDUCTOR MEMORY WITH THRESHOLD CURRENT SETTING CIRCUIT

CROSS-REFERENCE TO RELATED APPLICATIONS

The disclosure of Japanese Patent Application No. 2012-238045 filed on Oct. 29, 2012 including the specification, drawings and abstract is incorporated herein by reference in its entirety.

BACKGROUND

The present invention relates to semiconductor devices. For example, the present invention can be preferably applied to an optical-coupling type isolation amplifier used for transmitting and receiving optical signals.

Manufacturing instruments such as AC motors and inverters are widely used in the state of being controlled by control devices in factories and plants. There are many cases where electric power sources used for these manufacturing instruments are required to have high voltages. On the other hand, the control devices that give control signals to these instruments do not require electric power sources with high voltages. In other words, the control devices have only to be supplied with electric power sources whose voltage values are large enough to activate logic circuits the control devices include.

An optical-coupling type isolation amplifier, which has some regions of different voltages isolated from each other and transmits control signals, is used to materialize such control devices. The optical-coupling type isolation amplifier includes an input side (primary) circuit that receives a signal from a transmitter, and an output side (secondary) circuit that outputs a signal to a receiver.

The input side circuit includes an A/D (Analog to Digital) converter (for example, a delta-sigma AD converter), an encoder that encodes a signal sent from the transmitter, a driver that drives a light-emitting diode (LED), and the like. The output side circuit includes an optical receiver circuit that receives light emitted by the light-emitting diode, a decoder that decodes the signal encoded by the input side circuit, and the like.

In the optical-coupling type isolation amplifier, an optical signal is transmitted between the light-emitting diode and a photo diode by using a pulse-width modulated clock pulse for the signal transmission between the input side circuit and the output side circuit, so that both isolation and high-accurate signal transmission are realized.

As related technologies, Japanese Unexamined Patent Application Publications No. 2004-179982, No. 2008-236392, No. 2010-178327, and No. 2007-096593 disclose technologies which reduce pulse-width distortion generated in the output signals of optical-coupling type isolation amplifiers. In addition, Japanese Unexamined Patent Application Publication No. 2006-340072 discloses an optical-coupling type isolation amplifier that has improved noise tolerance.

SUMMARY

In addition, the disclosures of Japanese Unexamined Patent Application Publications No. 2004-179982, No. 2008-236392, No. 2010-178327, No. 2007-096593, and No. 2006-340072 are incorporated herein by reference. The following analyses are performed by the inventors of the present invention.

As described above, by utilizing the technologies disclosed by Japanese Unexamined Patent Application Publications No. 2004-179982, No. 2008-236392, No. 2010-178327, and No. 2007-096593, pulse-width distortion generated in the output signals of optical-coupling type isolation amplifiers can be reduced. Pulse-width distortion can be represented by the time of the decrease, increase, or the like of the pulse width of a signal at the secondary side (output signal) relative to the pulse width of the corresponding primary signal (input signal). The pulse-width distortion is an index indicating how faithfully an output signal reproduces the corresponding input signal, and very important in the evaluation of the accuracy and response of signal reproduction, and the like regarding an optical-coupling type isolation amplifier. In particular, in a system that uses pulse-width modulation for representing digital signals and has the amount of pulse-width distortion larger than a certain value, there is a high possibility that a digital signal is erroneously transmitted.

In an optical-coupling type isolation amplifier disclosed in Japanese Unexamined Patent Application Publication No. 2004-179982, a voltage (a signal amplitude or a threshold voltage) input into a comparator (denoted by a reference numeral 20 in the above patent application publication) is varied with the use of a peak hold circuit (denoted by a reference numeral 70 in the above patent application publication) and a calculation shift circuit (denoted by a reference numeral 76 in the above patent application publication). The optical-coupling type isolation amplifier disclosed in Japanese Unexamined Patent Application Publication No. 2004-179982 synthesizes a current from a current generated from a voltage (a voltage signal S1) output by a trans-impedance amplifier (TIA) on the signal side, and from a current generated from a voltage (a voltage signal S11) output by a trans-impedance amplifier (TIA) on the dummy side with the use of a current mirror circuit included in the calculation shift circuit. By drawing out the synthesized current from the input side of the comparator, a threshold voltage is varied in accordance with an input amplitude, or by varying a signal amplitude in accordance with the input amplitude, pulse-width distortion is improved.

However, the optical-coupling type isolation amplifier disclosed in Japanese Unexamined Patent Application Publication No. 2004-179982 has a problem regarding the linearity of the threshold voltage when the threshold voltage follows the input amplitude. The configuration of the calculation shift circuit is concretely disclosed in FIG. 3 of the above patent application publication. The calculation shift circuit disclosed in the above patent application publication performs the current synchronization with the use of plural current mirror circuits. In this case, it is thinkable that the value of the voltage output by the trans-impedance amplifier on the dummy side is almost fixed. On the other hand, the value of the voltage output by the trans-impedance amplifier on the signal side varies in accordance with the input amplitude (the magnitude of the input current). If the voltage output by the trans-impedance amplifier on the signal side varies, currents that flow through transistors included in the current mirror circuit vary (a phenomenon referred to as the so-called early effect of a transistor). If the current generated from the voltage on the signal side varies in accordance with the input amplitude, the synthesized current that is an output from the calculation shift circuit also varies. In other words, the linearity of the synthesized current to the input amplitude cannot be secured.

In the optical-coupling type isolation amplifier disclosed in the above patent application publication, because pulse-width distortion is improved by varying the signal amplitude or the threshold voltage input into the comparator, the linearity of the synthesized current has an effect on the linearity of the threshold voltage to the input amplitude. In other words, in the optical-coupling type isolation amplifier disclosed in the above patent application publication, the linearity of the threshold voltage to the input amplitude cannot be secured. If the linearity of the threshold voltage to the input amplitude cannot be secured, there is a possibility that a digital signal is erroneously transmitted depending on the input amplitude. Therefore, there is needed an optical-coupling type isolation amplifier that has high linearity of a threshold voltage in the case where the threshold voltage follows an input amplitude.

In addition, an optical-coupling type isolation amplifier disclosed in Japanese Unexamined Patent Application Publication No. 2008-236392 has a problem regarding the response characteristic of a threshold voltage because the optical-coupling type isolation amplifier is configured so that pulse-width distortion is reduced with the use of a delay circuit. In addition, in both optical-coupling type isolation amplifiers disclosed in Japanese Unexamined Patent Application Publications No. 2010-178327 and No. 2007-096593, because a threshold voltage is switched between two values, a wide range of an input amplitude cannot be dealt with. In addition, a technology disclosed in Japanese Unexamined Patent Application Publication No. 2006-340072 cannot reduce pulse-width distortion.

Other problems of the related arts and new features of the present invention will be revealed in accordance with the description of the present invention and the accompanying drawings hereinafter.

According to an aspect of the present invention, a semiconductor device which includes a first trans-impedance amplifier, a second trans-impedance amplifier, a peak hold circuit, a comparator, and a threshold current setting circuit is provided. The first trans-impedance amplifier converts a first current signal generated by a first photodiode, into which an optical signal is input, into a first voltage signal. The second trans-impedance amplifier converts a second current signal generated by a second photodiode, to which an optical signal is blocked, into a second voltage signal. The peak hold circuit holds the peak value of the first voltage signal. The comparator outputs a pulse on the basis of the first and second voltage signals. The threshold current setting circuit draws out a threshold current, which is proportional to a reference current generated on the basis of a voltage difference between a peak voltage output by the peak hold circuit and a reference voltage at the output node of the second photodiode, from the connection between the second photodiode and the second trans-impedance amplifier.

According to the aspect of the present invention, an optical-coupling type isolation amplifier, which has high linearity of a threshold voltage in the case where the threshold voltage follows an input amplitude, is provided.

BRIEF DESCRIPTION OF THE DRAWINGS

FIG. 7 is a diagram showing examples of the simulation result of the output of the comparator in the case where the threshold voltage input into the comparator is fixed;

FIG. 9 is a diagram showing examples of the simulation result of the output of the comparator in the case where the threshold voltage input into the comparator is varied;

FIG. 10 is a diagram showing an example of the simulation result of the output of the comparator in the case where a common-mode signal (common-mode noise) is applied to the optical receiver circuit 1;

FIG. 11 is a diagram showing examples of the output of the comparator in the case where a constant RVTH is varied;

FIG. 13 is a diagram showing examples of the output of the comparator in the case where hysteresis is introduced into the threshold voltage;

FIG. 14 is a diagram showing an example of the internal configuration of an optical receiver circuit according to a second embodiment of the present invention; and FIG. 15 is a diagram showing an example of the output of a comparator of the optical receiver circuit.

DETAILED DESCRIPTION

Figure 1:
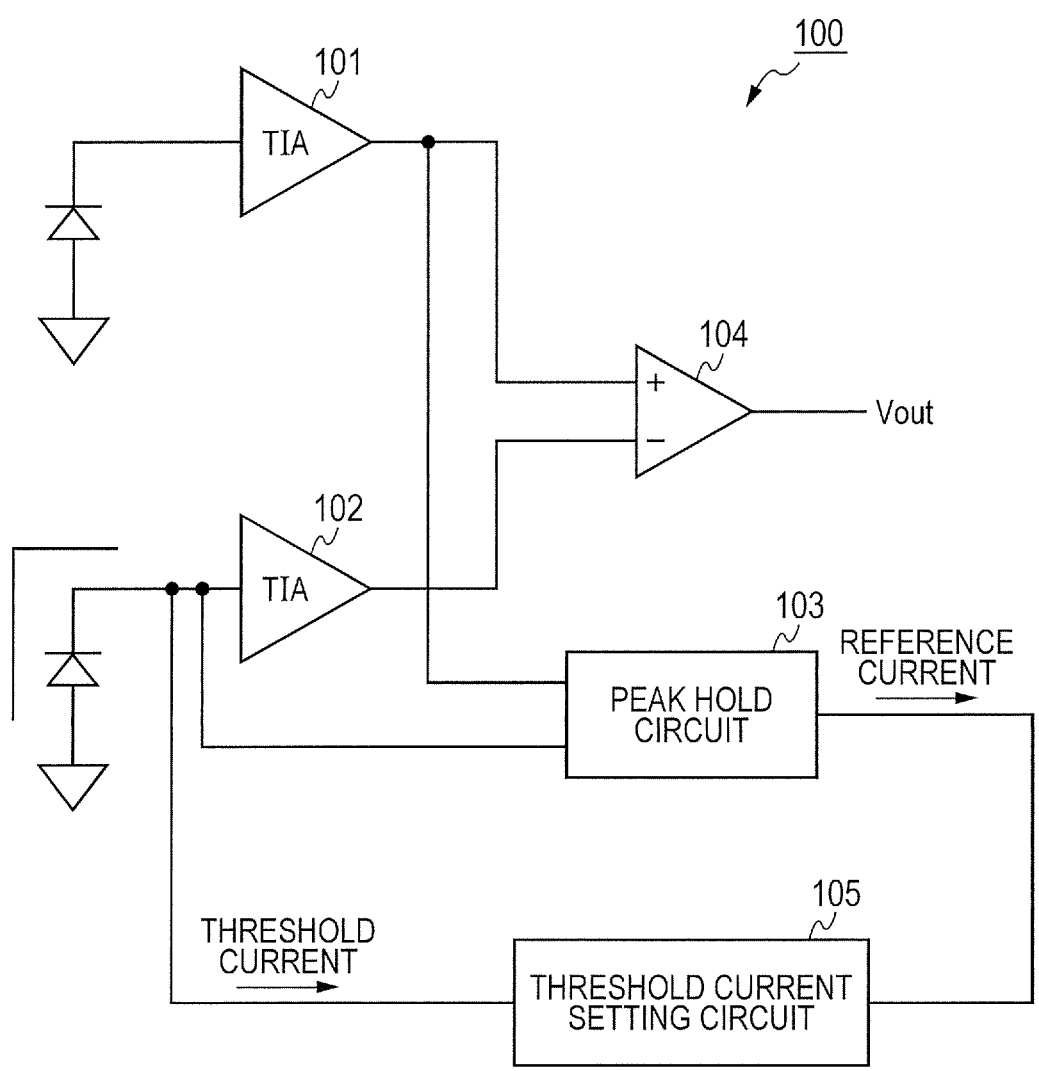
FIG. 1 is a diagram for explaining the outline of an embodiment.

First, the outline of an embodiment of the present invention will be described with reference to FIG. 1. Here, reference numerals drawn in this outline are attached to the components of the embodiment for convenience of understanding, and the description of the outline is not intended to limit the present invention.

As described above, there is needed an optical-coupling type isolation amplifier that has the high linearity of a threshold voltage in the case where the threshold voltage follows an input amplitude.

Therefore, as one example of such an optical-coupling type isolation amplifier, a semiconductor device 100 shown in FIG. 1 will be proposed. The semiconductor device 100 includes a first trans-impedance amplifier 101, a second trans-impedance amplifier 102, a peak hold circuit 103, a comparator 104, and a threshold current setting circuit 105. The first trans-impedance amplifier 101 converts a first current signal generated by a first photodiode, into which an optical signal is input, into a first voltage signal. The second trans-impedance amplifier 102 converts a second current signal generated by a second photodiode, to which an optical signal is blocked, into a second voltage signal. The peak hold circuit 103 holds the peak value of the first voltage signal. The comparator 104 outputs a pulse on the basis of the first and second voltage signals. The threshold current setting circuit 105 draws out a threshold current, which is proportional to a reference current generated on the basis of a voltage difference between a peak voltage output by the peak hold circuit 103 and a reference voltage at the output node of the second photodiode, from the connection between the second photodiode and the second trans-impedance amplifier 102.

In the semiconductor device 100, the peak hold circuit 103 holds the amplitude of the first voltage signal output by the first trans-impedance amplifier 101 on the signal side. The reference current is generated on the basis of the difference voltage between the peak voltage output by the peak hold circuit 103 and the voltage at the output node of the second photodiode on the dummy side. Because the voltage at the output node of the second photodiode on the dummy side is almost constant, by drawing out the threshold current, which is proportional to the reference current, from the connection between the second photodiode and the second trans-impedance amplifier 102, the threshold voltage (second voltage signal) input into the comparator 104 is made proportional to the input amplitude.

In addition, the threshold current is a current whose ratio to the reference current is a predefined ratio; therefore, the high linearity of the threshold current to the input amplitude can be obtained. Since the threshold voltage is determined by the threshold current, the high linearity of the threshold voltage to the input amplitude can be also realized. The proportionality and linearity of the threshold voltage (second voltage signal) will be described in detail hereinafter.

In addition, the following configurations are conceivable.

[Configuration 1]

A semiconductor device that includes: a first trans-impedance amplifier that converts a first current signal generated by a first photodiode, into which an optical signal is input, into a first voltage signal; a second trans-impedance amplifier that converts a second current signal generated by a second photodiode, to which an optical signal is blocked, into a second voltage signal; a peak hold circuit that holds the peak value of the first voltage signal; a comparator that outputs a pulse on the basis of the first and second voltage signals; and a threshold current setting circuit that draws out a threshold current, which is proportional to a reference current generated on the basis of a voltage difference between a peak voltage output by the peak hold circuit and a reference voltage at the output node of the second photodiode, from the connection between the second photodiode and the second trans-impedance amplifier.

[Configuration 2]

The threshold current setting circuit includes: a first resistor an end of which is coupled to the output node of the peak hold circuit; a buffer that receives a voltage at the other end of the resistor and the reference voltage; and a current mirror circuit the control terminal of which is coupled to the output node of the buffer, and it is preferable that the threshold current is the reference current that flows through the first resistor and that is reflexed at the current mirror circuit.

[Configuration 3]

It is preferable that the threshold current is generated so that the ratio of the amplitude of the second voltage signal to the amplitude of the first voltage signal is a predefined ratio.

[Configuration 4] It is preferable that the predefined ratio is determined on the basis of the current mirror ratio, of the current mirror circuit, the value of the first resistor, and the value of the second resistor included in the second trans-impedance amplifier.

[Configuration 5]

It is preferable that the predefined ratio is a value that is predetermined on the basis of the rising time and falling time of the first voltage signal.

[Configuration 6]

It is preferable that the current mirror circuit includes: a first-conductivity type first MOS transistor the drain of which is coupled to the other end of the first resistor and the gate of which is coupled to the output node of the buffer; and a first-conductivity type second MOS transistor the drain of which is coupled to the coupling node of the second photodiode and the second trans-impedance amplifier and the gate of which is coupled to the output node of the buffer.

[Configuration 7]

It is preferable that the threshold current setting circuit includes a plurality of current mirror circuits, and a current mirror circuit used for generating the threshold current is selected among the current mirror circuits on the basis of the level of a pulse output by the comparator.

[Configuration 8]

A method for designing an optical receiver circuit that receives a light signal and outputs a digital signal, including the steps of: validating the rising time and falling time of an input signal; and determining a ration of a threshold voltage that follows the amplitude of the input signal. In addition, this method is associated with a specific machine referred to as an optical receiver circuit.

Concrete embodiments will be described in detail with reference to the accompanying drawings hereinafter.

First Embodiment

A first embodiment will be described in detail with reference to the accompanying drawings.

Figure 2:
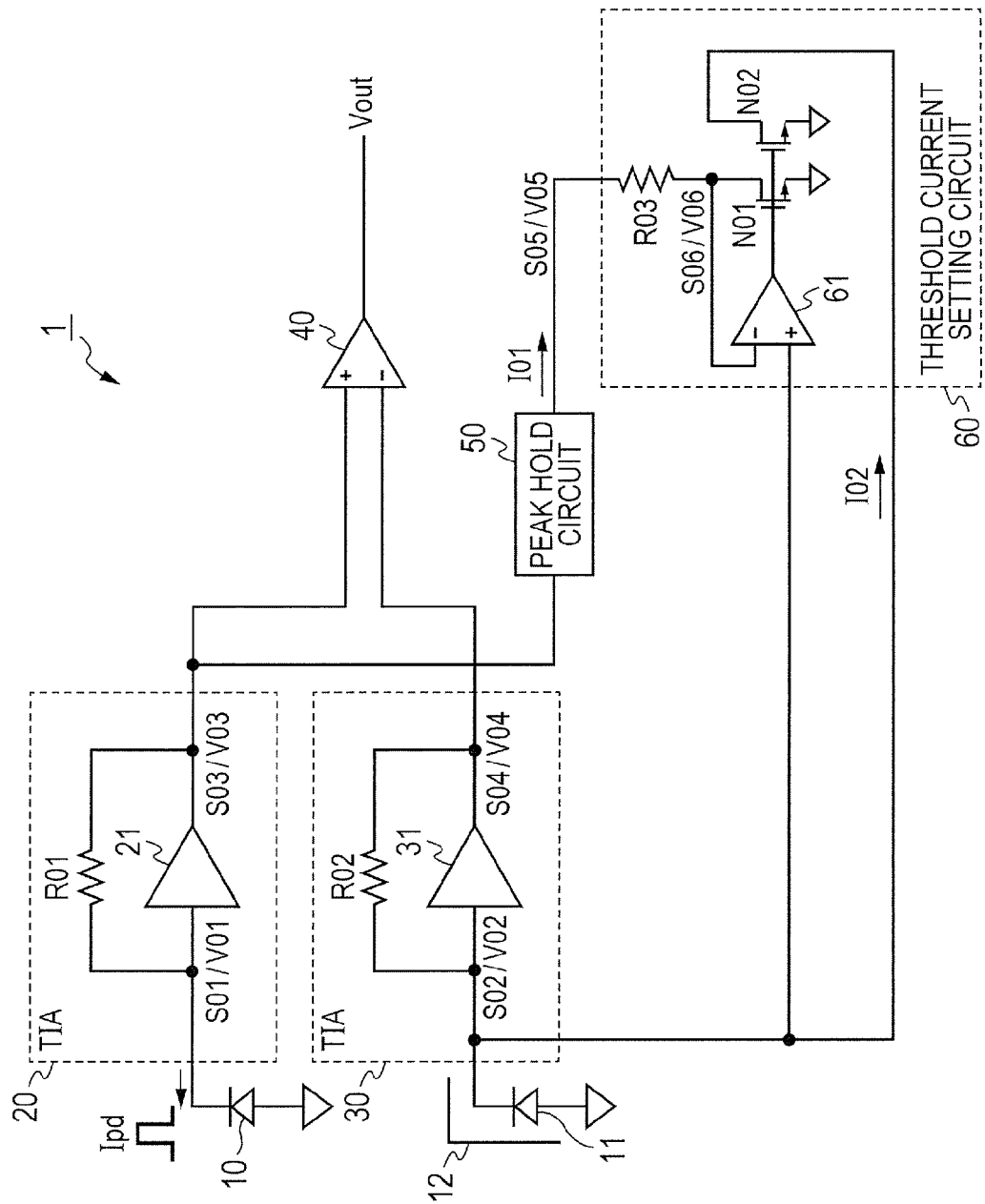
FIG. 2 is a diagram showing an example of the internal configuration of an optical receiver circuit according to a first embodiment of the present invention.

FIG. 2 is a diagram showing an example of the internal configuration of an optical receiver circuit 1 according to the first embodiment of the present invention. The optical receiver circuit 1 includes: a photodiodes 10 and 11; trans-impedance amplifiers 20 and 30; a comparator 40; a peak hold circuit 50; and a threshold current setting circuit 60.

The photodiode 10 receives an optical signal output by an input side circuit included in an optical-coupling type isolation amplifier, and converts the received optical signal into a current. In the following description, a current obtained by the conversion of the photodiode 10 will be denoted by an input current Ipd. The output node of the photodiode 10 is coupled to the input node of the trans-impedance amplifier 20.

The photodiode 11 is a dummy diode which has almost the same area as that of the photodiode 10 and to which light is blocked by a light-shielding plate 12. The output of the photodiode 11 is coupled to the input node of the trans-impedance amplifier 30. Here, the photodiode 11 is not coupled to the light-shielding plate 12. The reason is that it is necessary to make parasitic capacitance on the signal side and parasitic capacitance on the dummy side viewed from the output side circuit equal to each other.

The trans-impedance amplifiers 20 and 30 are amplifiers that respectively convert current signals output by the photodiodes 10 and 11 into voltage signals. The trans-impedance amplifier 20 includes an inverting amplifier 21 and a resistor R01. In addition, the configuration of the trans-impedance amplifier 30 is similar to that of the trans-impedance amplifier 20.

By making the configuration of the signal side circuit, which receives an optical signal, and that of the dummy side circuit, to which a light signal is blocked, equal to each other, the amount of noise generated owing to a displacement current through internal capacitance in association with a rapid potential variation between the input side and the output side of the signal side circuit and the amount of noise generated owing to a displacement current through internal capacitance in association with a rapid potential variation between the input side and the output side of the dummy side circuit become equal to each other. Both noises (common mode noises) respectively generated on the signal side and dummy side are eliminated by the operation of the comparator 40.

Figure 3:
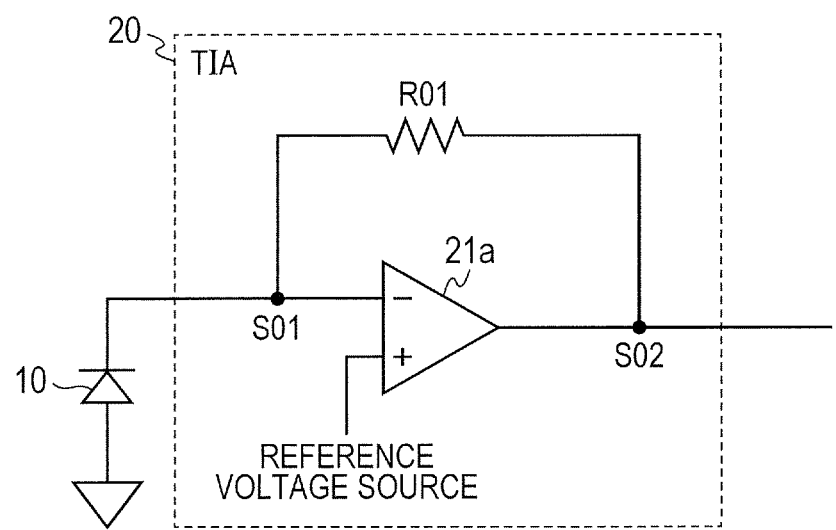
FIG. 3 is a diagram showing an example of a trans-impedance amplifier.

In addition, the inverting amplifier 21 shown in FIG. 2 can be materialized with the use of a field-effect transistor or a bipolar transistor. However, the configuration of the inverting amplifier 21 is not limited to the configuration of a circuit that inverts a single-phase signal. For example, as shown in FIG. 3, the trans-impedance amplifier 21 can be materialized with the use of an operational amplifier 21a. In this case, the inverting input terminal of the operational amplifier 21a and the output terminal of the photodiode 10 is coupled, and the non-inverting input terminal of the operational amplifier 21a is coupled to a reference voltage source. The configuration of an inverting amplifier 31 is also similar to that of the trans-impedance amplifier 21.

The non-inverting input terminal of the comparator 40 is coupled to the output node of the trans-impedance amplifier 20, and the inverting input terminal of the comparator 40 is coupled to the output node of the trans-impedance amplifier 30. The comparator 40 outputs a pulse in accordance with voltage signals received by the non-inverting input terminal and by the inverting input terminal. The output Vout of the comparator 40 is converted into a digital signal via a decoder coupled to the optical receiver circuit 1 and the like.

Figure 4:
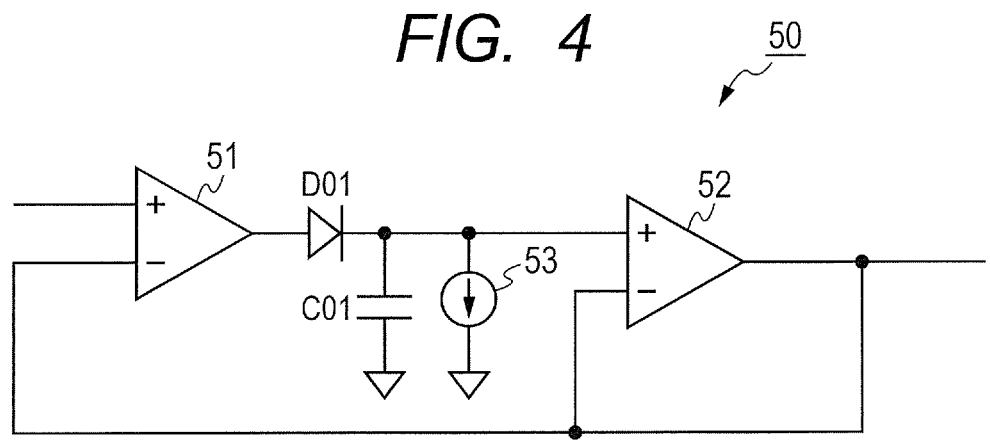
FIG. 4 is a diagram showing an example of a peak hold circuit.

The peak hold circuit 50 holds the peak value of a voltage signal output by the trans-impedance amplifier 20. The peak hold circuit 50 can be configured, for example, as shown in FIG. 4. To put it more concretely, the peak hold circuit 50 includes: operational amplifiers 51 and 52; a diode D01; a hold capacitor C01; and a discharge current source 53. Here, the configuration of the peak hold circuit 50 shown in FIG. 4b is an exemplification and is not intended to limit the configuration of the peak hold circuit 50. A voltage signal output by the peak hold circuit 50 is input into the threshold current setting circuit 60.

The threshold current setting circuit 60 includes an operational amplifier 61, a resistor R03, N-channel MOS transistors N01 and N02 (Refer to FIG. 2). One end of the resistor R03 is coupled to the output node of the peak hold circuit 50, and the other end is coupled to the drain of the N-channel MOS transistor N01 and the inverting input terminal of the operational amplifier 61. The non-inverting input terminal of the operational amplifier 61 is coupled to the connection node between the photodiode 11 and the trans-impedance amplifier 30. The gates (control terminals) of N-channel MOS transistors N01 and N02 are coupled to each other, and also coupled to the output node of the operational amplifier 61. In addition, the drain of the N-channel MOS transistor N02 is coupled to the connection node between the photodiode 11 and the trans-impedance amplifier 30.

Although one example of the concrete configuration of the threshold current setting circuit 60 has been shown in FIG. 2, this configuration shown in FIG. 2 is not intended to limit the configuration of the threshold current setting circuit 60. As described later, it will be understood that the threshold current setting circuit 60 is a circuit that draws out a threshold current, which is proportional to a reference current generated on the basis of a voltage difference between a peak voltage output by the peak hold circuit 50 and a reference voltage at the photodiode 11 at the dummy side, from the connection between the photodiode 11 and the trans-impedance amplifier 30. In addition, for illustrative purpose, the N-channel MOS transistors are used as transistors forming the current mirror circuit included in the threshold current setting circuit 60. However, these N-channel MOS transistors are not used to limit the transistors forming the current mirror circuit to N-channel MOS transistors, and it is possible to replace the N-channel MOS transistors with P-channel MOS transistors if the connection of electric power supplies are accordingly changed. In addition, it goes without saying that bipolar transistors can be used instead of MOS transistors.

For convenience of the following explanation, names of nodes, voltages, and currents regarding the optical receiver circuit 1 shown in FIG. 2 will be defined as follows:

The input node of the inverting amplifier 21 will be represented by a node S01.

The input node of the inverting amplifier 31 will be represented by a node S02.

The output node of the trans-impedance amplifier 20 will be represented by a node S03.

The output node of the trans-impedance amplifier 30 will be represented by a node S04.

The output node of the peak hold circuit 50 will be represented by a node S05.

The connection node between the resistor R03 and the N-channel MOS transistor N01 will be represented by a node S06.

In addition, voltages at the node S01 to the node S06 will be respectively represented by a voltage V01 to a voltage V06. For example, the voltage at the node S01 is the voltage V01. In addition, the voltage V02 at the node S02 will be also represented by a reference voltage Vref. In addition, the voltage V03 relative to the reference voltage Vref will be represented by an input amplitude SGa, and the voltage V04 relative to the reference voltage Vref will be represented by a threshold voltage Vth.

A current flowing from the peak hold circuit 50 to the threshold current setting circuit 60 will be represented by a reference current I01. A current flowing from the node S02 to the threshold current setting circuit 60 will be represented by a reference current I02. In addition, if it is not necessary to distinguish reference numerals of the resistors R01 to R03 from the resistor values thereof, the resistor values of the resistors R01 to R03 are respectively denoted by R01 to R03. For example, the resistor value of the resistor R01 is denoted by R01.

Next, the operation of the optical receiver circuit 1 will be explained.

Figure 5:
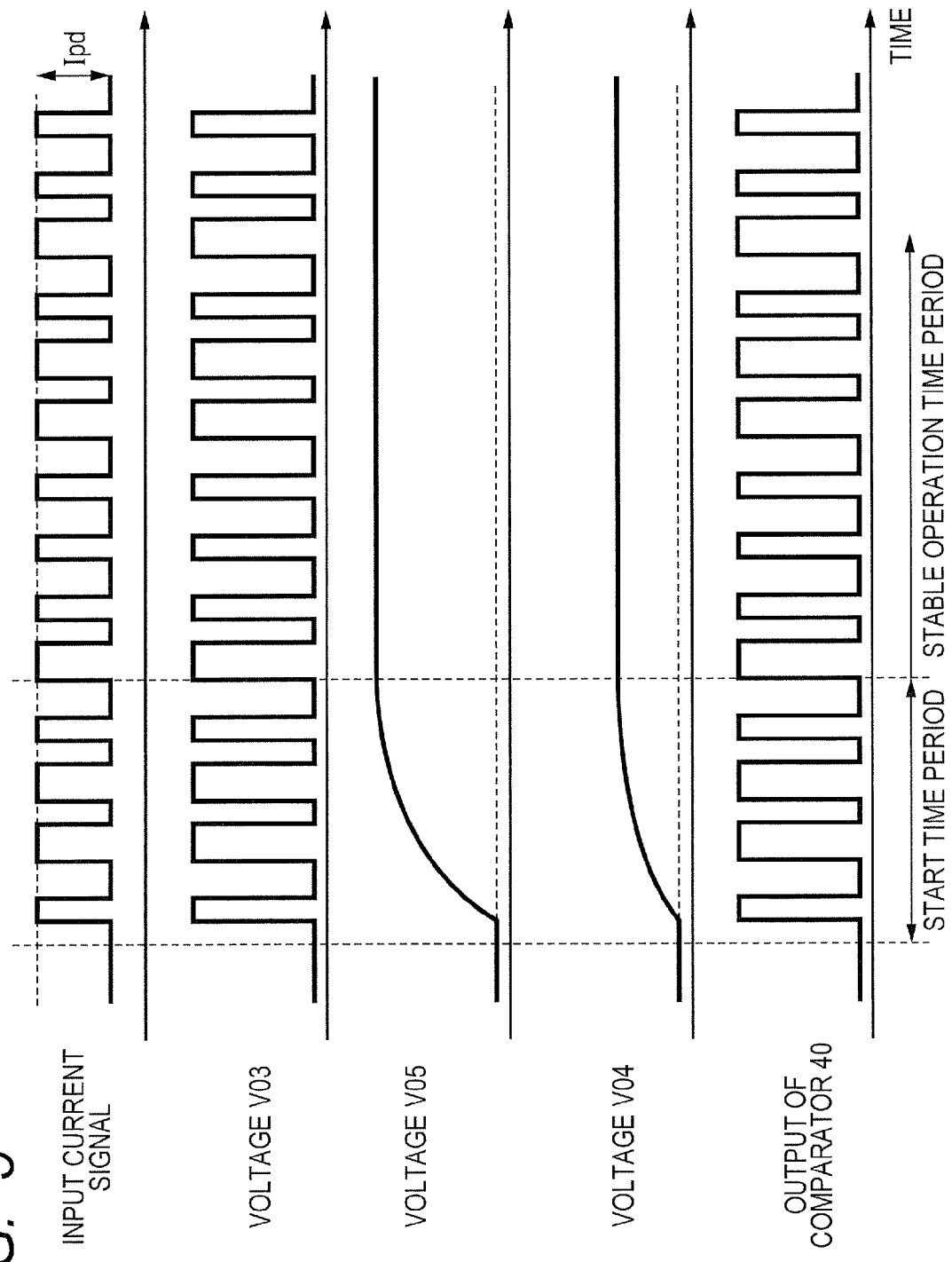
FIG. 5 is a diagram showing examples of various signals for explaining the operation of the optical receiver circuit.

FIG. 5 is a diagram showing examples of various signals for explaining the operation of the optical receiver circuit 1. As preparatory for describing the operation of the optical receiver circuit 1, some voltages, currents, and the like will be discussed in the case where the input current signal, whose amplitude is Ipd, is input into the trans-impedance amplifier 20.

The peak value V03P of the voltage V03 output by the trans-impedance amplifier 20 is given by the following Equation (1).

$$V03P = Ipd \times R01 \qquad (1)$$

The peak hold circuit 50 holds the peak value of the voltage V03 output by the trans-impedance amplifier 20. The voltage output by the peak hold circuit 50 will be represented by a peak voltage Vp. The peak voltage Vp can be given by the following Equation (2). Here, it will be assumed that components included in the peak hold circuit 50 (for example, a hold capacitor C01 and a discharge current source 53) are appropriately set in view of a clock cycle.

$$Vp = V03P = Ipd \times R01 \qquad (2)$$

On the hand, the operational amplifier 61 included in the threshold current setting circuit 60 operates so that the potentials at nodes S02 and S06, which are coupled to the operational amplifier 61, coincide with each other. Therefore, it can be considered that the voltage V06 is equal to the reference voltage Vref. In addition, the reference current I01 is given by the following Equation (3).

$$I01 = (Vp - V06)/R03 = (V03P - Vref)/R03 \qquad (3)$$

Here, because the reference voltage Vref is a voltage at the node S02, that is, the output node of the photodiode 11 on the dummy side, V03P-Vref in Equation (3) is equal to SGa. Therefore, V03P-Vref in Equation (3) can be replaced by SGa as shown in Equation (4).

$$SGa = V03P - Vref \quad (4)$$

In addition, because a current mirror circuit is comprised of N-channel MOS transistors N01 and N02, if the current mirror ratio of the current mirror is represented by CMR12, the threshold current I02 is given by the following Equation (5).

$$I02 = CMR12 \times I01 \quad (5)$$

By substituting Equations (3) and (4) for Equation (5), the following Equation (6) is given.

$$I02 = SGa \times CMR12/R03 \quad (6)$$

The comparator outputs an H level if the voltage V03, which is input into its non-inverting input terminal of the comparator 40, is higher than the voltage V04, which is input into its inverting input terminal, and outputs an L level if the voltage V03 is lower than the voltage V04. In other word, because the input amplitude SGa is an amplitude of an input signal into which the optical signal is converted, the voltage V04 can be regarded as a threshold voltage that determines the logic (an H level or an L level) of the input signal. Therefore, as described above, the voltage V04 for the reference voltage Vref is defined as the threshold voltage Vth.

Because the threshold current I02 is a current drawn out from the trans-impedance amplifier 30, the threshold voltage Vth, which is measured on the basis of the reference voltage Vref and applied to the inverting input terminal of the comparator 40, is given by the following Equation (7).

$$Vth = V04 - Vref = I02 \times R02 = SGa \times CMR12 \times R02/R03 \quad (7)$$

By replacing a constant (CMR12×R02/R03) in Equation (7) by a constant RVTH, Equation (8) is obtained from Equation (7).

$$Vth = RVTH \times SGa \quad (8)$$

$$RVTH = CMR12 \times R02/R03 \quad (9)$$

The constant RVTH defined by Equation (9) can be regarded as a constant that determines the ration of the threshold voltage Vth to the input amplitude SGa from the Equation (8). In other words, judging from Equation (8), it can be understood that the threshold current setting circuit 60 generates the threshold current I02 so that the threshold voltage Vth follows the input amplitude with the predefined ratio (the constant RVTH) kept as it is. In addition, because the constant RVTH is defined by the current mirror ration CMR12, the resistor values of the resistors R02 and R03, the ratio of the threshold voltage Vth to the input amplitude SGa can be determined in advance in the design stage of the optical receiver circuit 1. The waveform of the output of the comparator 40 shown in FIG. 5 is a waveform obtained in the case where the constant RVTH is set to 0.5.

By making the threshold voltage input into the comparator (the amplitude of the voltage signal output by the trans-impedance amplifier 30) follow the amplitude of the input signal (the amplitude of the voltage signal output by the trans-impedance amplifier 20) with a predefined ratio as described above, pulse-width distortion can be improved.

Figure 6A:
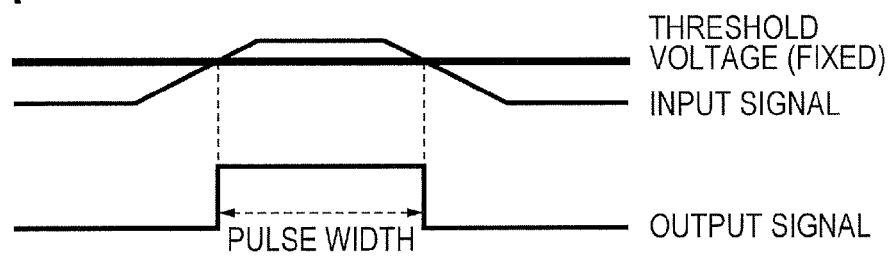
FIG. 6A to FIG. 6C are diagrams showing examples of the outputs of a comparator in the case where a threshold voltage input into the comparator is fixed.
Figure 6B:
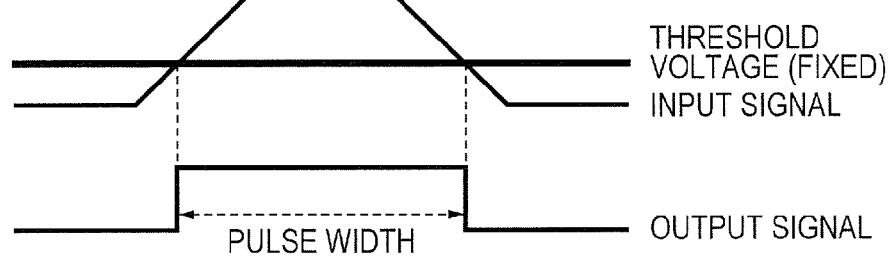
Figure 6C:
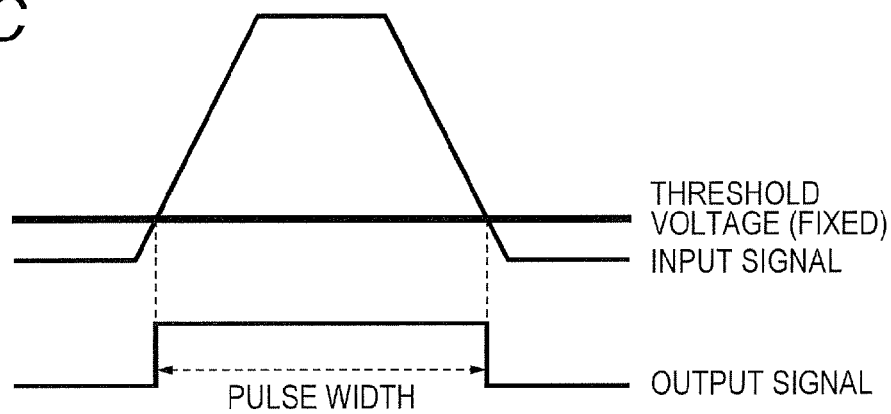

FIG. 6A to FIG. 6C are diagrams showing examples of the outputs of the comparator in the case where the threshold voltage input into the comparator is fixed. As shown in FIG. 6A to FIG. 6C, if the threshold voltage input into the comparator is fixed, the pulse width of the output of the comparator varies in accordance with the variation of the input amplitude. In digital signal transmission with the use of clock-width modulation, if a pulse width is shorter than a predefined time period, the datum corresponding to the pulse width is judged to be "0", and if the pulse width is longer than the predefined time period, the datum corresponding to the pulse width is judged to be "1". Therefore, if the pulse width varies in accordance with the variation of the input amplitude, there is a possibility that the decoder coupled to the optical receiver circuit 1 erroneously judges the logic of a digital signal.

FIG. 7 is a diagram showing examples of the simulation result of the output of the comparator in the case where the threshold voltage input into the comparator is fixed. In the simulation shown in FIG. 7, the threshold voltage is fixed and the input amplitude is switched among three values. As is clear from FIG. 7, the pulse width varies in accordance with the input amplitude.

Figure 8A:
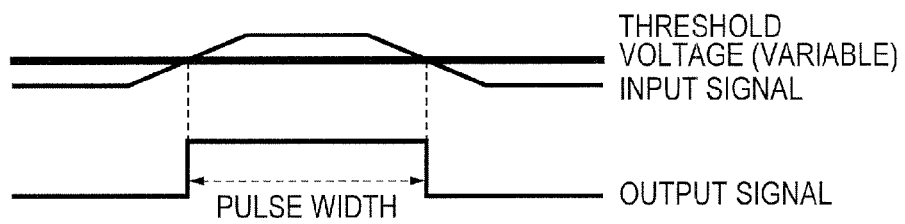
FIG. 8A to FIG. 8C are diagrams showing examples of the output of the comparator in the case where the threshold voltage input into the comparator is proportional to an input amplitude.
Figure 8B:
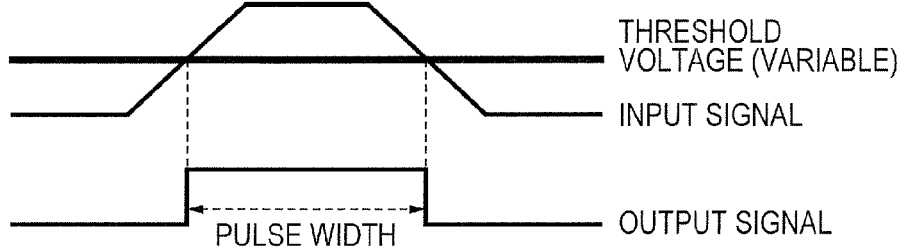
Figure 8C:
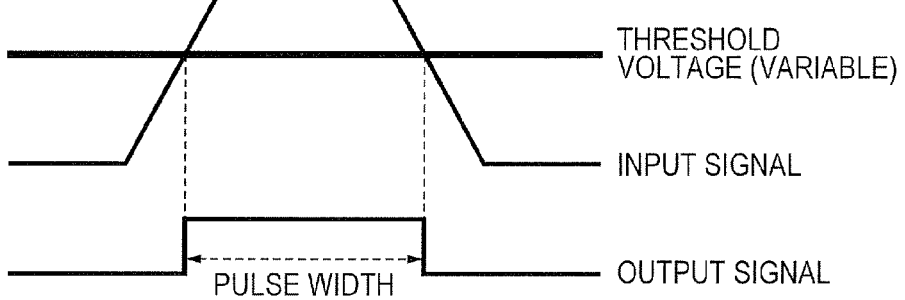

FIG. 8A to FIG. 8C are diagrams showing examples of the output of the comparator in the case where the threshold voltage input into the comparator is proportional to the input amplitude. As shown in FIG. 8A to FIG. 8C, by making the threshold voltage input into the comparator proportional to the input voltage, the pulse width of the output of the comparator can be set constant. In the examples shown in FIG. 8A to FIG. 8C, because the constant RVTH is set to 0.5, the threshold voltage follows the input signal so that the value of the threshold voltage becomes the middle value of the input amplitude.

FIG. 9 is a diagram showing examples of the simulation result of the output of the comparator in the case where the threshold voltage input into the comparator is varied. As is clear from FIG. 9, even if the input amplitude largely varies, the pulse width of the output of the comparator remains almost constant.

Here, even if the pulse-width distortion is improved, if the common-mode signal rejection characteristic deteriorates, it is not acceptable. Therefore, the common-mode rejection characteristic of the optical receiver circuit 1 will be verified by simulation. The common-mode signal rejection characteristic is the values of tolerable quantity that does not cause erroneous outputs vs. the rapid potential variation between the input and output of the optical-coupling type isolation amplifier. A displacement current owing to capacitance inside the package of the optical-coupling type isolation amplifier in associated with the potential variation between the input and output of the optical-coupling type isolation amplifier becomes an input current into the optical receiver circuit. Therefore, a phenomenon that the input amplitude generated by the potential variation exceeds the threshold voltage of the comparator leads directly to the malfunction of the optical receiver circuit 1. In other words, the optical receiver circuit is requested to have a high tolerance to the displacement current.

FIG. 10 is a diagram showing an example of the simulation result of the output of the comparator in the case where a common-mode signal (common-mode noise) is applied to the optical receiver circuit 1. In the simulation shown in FIG. 10, a rectangular signal is input into the signal side, and at the same time, a common-mode sine-wave signal is input into both signal side and dummy side. As is clear from FIG. 10, the common-mode signal rejection characteristic of the optical receiver circuit 1 is excellent.

Next, how to determine the constant RVTH will be described.

In FIG. 5 to FIG. 10, the constant RVTH has been set to 0.5. In other words, the constant RVTH is determined so that the value of threshold voltage Vth becomes the middle value of the input amplitude SGa. The value of the constant RVTH 0.5 is a value that is appropriate when the rising time and falling time of the input signal are equal to each other. However, if the rising time and falling time of the input signal are not equal to each other, setting the value of the constant RVTH to a value other than 0.5, that is, deviating the value of the constant RVTH from the middle value of the input amplitude SGa may generates a better pulse-width modulated waveform.

FIG. 11 is a diagram showing examples of the output of the comparator in the case where the constant RVTH is varied. As shown in FIG. 11, in the case where the rising time and falling time of the input signal are not equal to each other, setting the value of the constant RVTH to 0.8 generates a more stable PMW waveform (the pulse width of the output of the comparator is closer to a half of the cycle T of an input signal) than setting the value of the constant RVTH to 0.5.

In view of the above, it is recommendable that the following procedure is taken in determining the constant RVTH.

The rising time and falling time of an input signal are examined.

The constant RVTH is determined on the basis of the obtained rising time and falling time with the pulse width of the output of the comparator being a half of the cycle T of an input signal as a goal.

In the optical receiver circuit 1 according to this embodiment, the peak hold circuit 50 holds the amplitude of the voltage signal output by the trans-impedance amplifier 20 on the signal side. By dividing the voltage difference between the peak voltage Vp output by the peak hold circuit 50 and the reference voltage Vref at the photodiode 11 on the dummy side by the resistor R03, the reference current I01 is generated (Refer to Equation (3)). Because the voltage Vref at the output node of the photodiode 11 is almost constant, it is conceivable that the reference current I01 is almost proportional to the input amplitude SGa. In other words, the linearity of the reference current I01 to the input amplitude SGa is extremely high.

The threshold current I02 is a current whose ratio to the reference current I01 is a predefined ratio. Therefore, the linearity of the threshold current I02 to the input amplitude SGa is also high as the reference current I01 is. Because the threshold voltage Vth is determined by the threshold current I02 (Refer to Equation (7)), the high linearity of the threshold voltage Vth to the input amplitude SGa can be realized. The realization of the high linearity of the threshold voltage Vth to the input amplitude SGa leads to the reduction in the number of misjudgments of digital signals. In addition, because the optical receiver circuit 1 does not use complex circuits such as the operation shift circuit disclosed in Japanese Unexamined Patent Application Publication No. 2004-179982, such a problem as involves the variation of a threshold voltage in accordance with the variation of a power supply voltage does not occur.

As described above, in the optical receiver circuit 1 according to this embodiment, pulse-width distortion can be improved with the common-mode signal rejection characteristic kept as it is. In particular, in the case where light-emitting diodes and photodiodes are used in signal transmission from an input side circuit to an output side circuit, effects owing to the characteristic variations (the variation in the temperature characteristic or aging degradation) of the light-emitting diodes or the characteristic variation (the variation in the temperature characteristic) of the photodiodes are not negligible. Therefore, in the case where an optical receiver circuit used in an optical-coupling type isolation amplifier has the dependency of pulse-width distortion on an input amplitude (the dependency on an input current), there is a possibility that the regeneration errors of digital signals occur owing to the temperature characteristics, the aging degradation, and the like. From such a view point as above, it is necessary that an optical receiver circuit should not have the dependency of pulse-width distortion on an input amplitude, and also it is necessary that the high linearity of a threshold voltage to an input amplitude should be secured.

Second Embodiment

A second embodiment will be described in detail with reference to the accompanying drawings.

In the optical receiver circuit 1 according to the first embodiment, the high linearity of the threshold voltage to an input amplitude can be secured. However, if the waveform vibration (ringing) of an input signal occurs in the rising or falling of the input signal, there is a possibility that the comparator outputs an erroneous signal.

Figure 12:
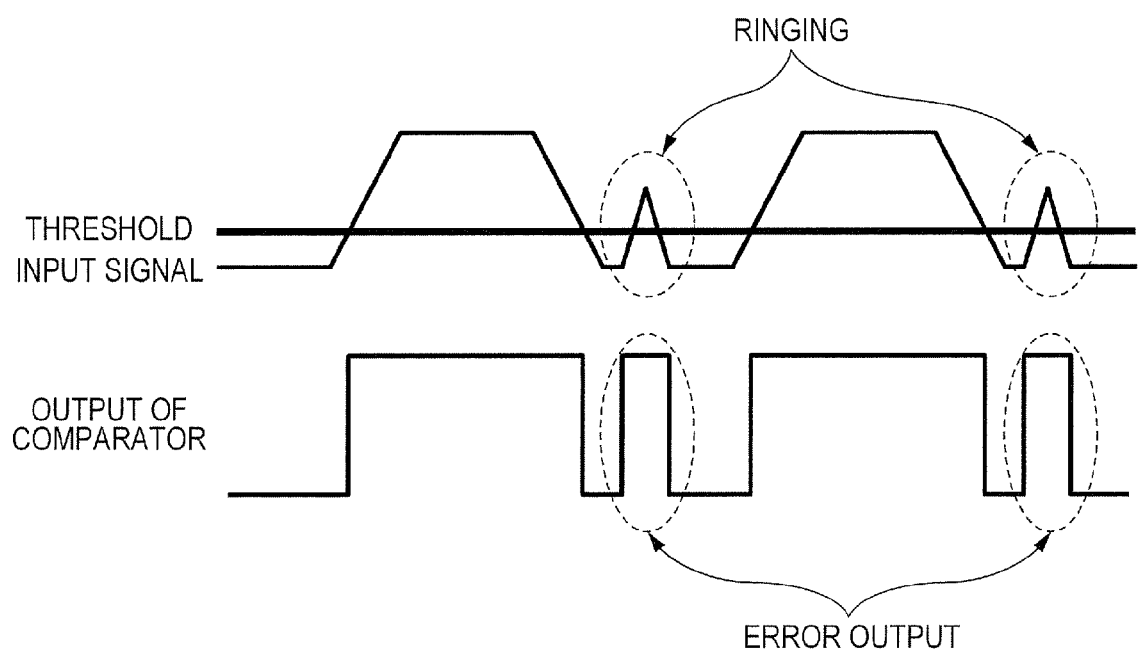
FIG. 12 is a diagram for explaining the effect of ringing of an input signal.

FIG. 12 is a diagram for explaining the effect of ringing of an input signal. As shown in FIG. 12, if a ringing occurs in the falling of the input signal, and the peak of the ringing exceeds the threshold voltage, the comparator outputs an erroneous signal. Therefore, it is conceivable that control that differentiates the level of the threshold voltage in the rising time of the input signal and the level of the threshold voltage in the falling time of the input signal is performed. In other words, the control that averts the effect of the ringing by introducing hysteresis into the threshold voltage is performed. To put it more concretely, after the input signal rises, the threshold voltage is set low, so that, even if a ringing with a high absolute peak value occurs, the level of the input signal including the ringing does not become less than the threshold voltage. On the other hand, after the input signal falls, the threshold voltage is set high so that the peak value of a ringing does not exceed the threshold voltage. However, introducing only hysteresis into the threshold voltage generates pulse-width distortion.

FIG. 13 is a diagram showing examples of the output of the comparator in the case where hysteresis is introduced into the threshold voltage. The waveforms shown in FIG. 13 are obtained on the condition that, although hysteresis is introduced into the threshold voltage, the threshold voltage is switched between two values and these two values are fixed. Because the threshold voltage does not vary in accordance with an input signal, the pulse width of the output of the comparator varies in accordance with the amplitude of the input signal. In other words, in the case where only hysteresis is introduced into the threshold voltage in order to cancel the effect of ringing generated in the input signal, pulse-width distortion cannot be resolved.

Therefore, in the case of an optical receiver circuit 2 according to this embodiment, while the effect of ringing generated in the input signal can be canceled, pulse-width distortion can be improved at the same time.

FIG. 14 is a diagram showing an example of the internal configuration of the optical receiver circuit 2 according to this embodiment. Components in FIG. 14 that are the same as those in FIG. 2 are respectively given the same numeral references and explanations about these components will be omitted.

A difference between the optical receiver circuit 1 and the optical receiver circuit 2 is that the optical receiver circuit 2 has two serially coupled inverter circuits INV01 and INV02 that are coupled to the output node of the comparator 40 and that the internal configuration of a threshold current setting circuit 60a of the optical receiver circuit 2 is different from that of the threshold current setting circuit 60 of the optical receiver circuit 1.

In the internal configuration of the threshold current setting circuit 60a, two N-channel MOS transistors N03 and N04 and four switches SW01 to SW04 are added to and the N-channel MOS transistors N02 is deleted from the threshold current setting circuit 60. The switches SW01 to SW04 can be materialized with the use of transfer gates or the like, but the transfer gates are not intended to limit components used as the switches SW01 to SW04.

The switches SW01 to SW04 are switched in order to select the N-channel MOS transistor N03 or N-channel MOS transistor N04 to be used for forming a current mirror circuit with the N-channel MOS transistor N01 in accordance with the logic level (level of the output pulse) of the comparator 40. For example, if the output signal of the comparator 40 is an L level, the switches SW01 to SW04 are switched so that the N-channel MOS transistors N01 and N03 form the current mirror circuit. To put it more concretely, if the output signal of the comparator 40 is an L level, the switches SW01 and SW04 are tuned on and the switches SW02 and SW03 are tuned off. On the other hand, if the output signal of the comparator 40 is an H level, the switches SW01 to SW04 are switched so that the N-channel MOS transistors N01 and N04 form the current mirror circuit.

Because the operation of the threshold current setting circuit 60a in both cases of the current mirror being formed with the N-channel MOS transistors N01 and N03 and the current mirror being formed with the N-channel MOS transistors N01 and N04 are not different from the already-described operation of the threshold current setting circuit 60 of the optical receiver circuit 1 according to the first embodiment, the operation of the threshold current setting circuit 60a will be omitted.

In the threshold current setting circuit 60a, a constant RVTH1 that is the RVTH of a current mirror circuit formed by the N-channel transistors N01 and N03 and a constant RVTH2 that is the RVTH of a current mirror circuit formed by the N-channel transistors N01 and N02 are set to be different from each other. For example, by setting the constant RVTH1 to 0.7 and the constant RVTH2 to 0.3, the threshold voltage Vth that is input into the comparator 40 has hysteresis relative to the input amplitude SGa and follows the input amplitude SGa with a constant ratio. In other words, the effect of ringing generated in the input signal is canceled by introducing the hysteresis into the threshold voltage Vth, and at the same time, the pulse-width distortion is improved by making the threshold voltage automatically vary in accordance with the input amplitude SGa (or by making the threshold voltage follow the input amplitude SGa).

FIG. 15 is a diagram showing an example of the output of the comparator of the optical receiver circuit 2. As shown in FIG. 15, if the level of an input signal exceeds the threshold voltage Vth in the rising of the input signal, the level of the input signal is considered to be an H level. In this case, the threshold voltage Vth is set below the middle value of the input amplitude SGa (for example, the constant RVTH is set to 0.3), so that, even if ringing is generated in the input signal, it is not thinkable that the level of the input signal including the ringing becomes below the reset threshold voltage, and therefore there is no possibility that the comparator outputs an erroneous signal. Similarly, in the case of the falling of the input signal, by setting the threshold voltage Vth above the middle value of the input amplitude SGa, the effect of the ringing generated in the input signal can be canceled.

The threshold voltage Vth follows the input amplitude SGa with a ratio determined by the constant REVTH1 or the constant RVTH2. Therefore, the pulse-width of the output of the comparator 40 becomes constant. In other words, pulse-width distortion does not occur.

As described above, in the threshold current setting circuit 60a included in the optical receiver circuit 2, two current mirror circuits are formed with the use of three transistors, and these two current mirror circuits are switched on the basis of the logic level of the output signal of the comparator 40. However, the configuration shown in FIG. 14 is not intended to limit the configuration of the threshold current setting circuit 60a. For example, it is conceivable that two current mirror circuits, each of which is formed by two transistors in advance, are alternately switched. In other words, it should be understood that the threshold current setting circuit 60a is a circuit including plural current mirror circuits and these current mirror circuits are appropriately switched on the basis of the logic level of the output signal of the comparator 40 to generate the threshold current I02.

As described above, the optical receiver circuit 2 according to this embodiment introduces hysteresis into the threshold voltage, and at the same time, makes the threshold voltage follow the input amplitude with predefined ratios. As a result, the comparator is prevented from outputting an erroneous signal owing to ringing generated in an input signal, and at the same time, the improvement of pulse-width distortion is attained.

In addition, the disclosures of the above referenced Japanese Unexamined Patent Application Publications No. 2004-179982, No. 2008-236392, No. 2010-178327, No. 2007-096593, and No. 2006-340072, and the like are incorporated herein by reference. Within the scope of all the disclosures of the present invention (including those of the appended claims) and on the basis of the fundamental technological ideas thereof, the above embodiments and examples may be modified and adjusted. In addition, within the scope of the claims of the present invention, a variety of combinations and selections of various disclosed elements (including the elements disclosed in the appended claims, the elements disclosed in the examples, and the elements disclosed in the appended drawings) may be made. In other words, it goes without saying that the present invention includes various changes and modifications that may be made by those skilled in the art in accordance with all the disclosures including the disclosures of the claims and the technological ideas thereof. In particular, as for the numerical ranges described in this specification, it should be understood that any values or any small ranges falling within the above numerical ranges are described for concrete exemplifications even if they are not specified so.

What is claimed is:

1. A semiconductor device comprising:
   a first trans-impedance amplifier that converts a first current signal generated by a first photodiode, into which an optical signal is input, into a first voltage signal;
   a second trans-impedance amplifier that converts a second current signal generated by a second photodiode, to which an optical signal is blocked, into a second voltage signal;
   a peak hold circuit that holds the peak value of the first voltage signal;
   a comparator that outputs a pulse on the basis of the first and second voltage signals; and
   a threshold current setting circuit that draws out a threshold current, which is proportional to a reference current generated on the basis of a voltage difference between a peak voltage output by the peak hold circuit and a reference voltage at the output node of the second photodiode, from the connection between the second photodiode and the second trans-impedance amplifier, wherein the threshold current setting circuit includes:

a first resistor an end of which is coupled to the output node of the peak hold circuit;

a buffer that receives a voltage at the other end of the resistor and the reference voltage; and a current mirror circuit the control terminal of which is coupled to the output node of the buffer, wherein the threshold current is the reference current that flows through the first resistor and that is reflexed at the current mirror circuit.

2. The semiconductor device according to claim 1, wherein the threshold current is generated so that the ratio of the amplitude of the second voltage signal to the amplitude of the first voltage signal is a predefined ratio.

3. The semiconductor device according to claim 1, wherein the current mirror circuit includes:

a first-conductivity type first MOS transistor the drain of which is coupled to the other end of the first resistor and the gate of which is coupled to the output node of the buffer; and a first-conductivity type second MOS transistor the drain of which is coupled to the coupling node of the second photodiode and the second trans-impedance amplifier and the gate of which is coupled to the output node of the buffer.

4. The semiconductor device according to claim 1, wherein the threshold current setting circuit including a plurality of current mirror circuits, selects a current mirror circuit used for generating the threshold current from among the current mirror circuits on the basis of the level of a pulse output by the comparator.

5. The semiconductor device according to claim 2, wherein the predefined ratio is determined on the basis of the current mirror ratio of the current mirror circuit, the value of the first resistor, and the value of the second resistor included in the second trans-impedance amplifier.

6. The semiconductor device according to claim 5, wherein the predefined ratio is a value that is predetermined on the basis of the rising time and falling time of the first voltage signal.

* * * * *